United States Patent
Rey et al.

(12)

(10) Patent No.: US 6,746,991 B2
(45) Date of Patent: Jun. 8, 2004

(54) MANUFACTURING PROCESS FOR AN ELECTRICALLY INSULATING AND MECHANICALLY STRUCTURING SHEATH ON AN ELECTRIC CONDUCTOR

(75) Inventors: Jean-Michel Rey, Sceaux (FR); Sandrine Marchant, Joinville le Pont (FR); Arnaud Devred, Paris (FR); Eric Prouzet, Montpellier (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/197,828

(22) Filed: Jul. 19, 2002

(65) Prior Publication Data

US 2003/0017950 A1 Jan. 23, 2003

(30) Foreign Application Priority Data

Jul. 20, 2001 (FR) .............................. 01 09741

(51) Int. Cl.[7] .............................. B05D 3/02; B05D 5/12
(52) U.S. Cl. .................... 505/470; 505/740; 427/376.2; 427/58; 427/443.2
(58) Field of Search ............................. 427/376.2, 58, 427/430.1, 434.2, 443.2, 177; 505/739, 740, 742, 470

(56) References Cited

U.S. PATENT DOCUMENTS

| 5,021,401 A | | 6/1991 | Snyder et al. | |
|---|---|---|---|---|
| 5,035,724 A | * | 7/1991 | Pukari et al. | .................. 51/309 |
| 6,387,852 B1 | * | 5/2002 | Celik et al. | .................. 505/434 |

FOREIGN PATENT DOCUMENTS

| EP | 0 044 144 | | 1/1982 | |
|---|---|---|---|---|
| EP | 0 188 370 | | 7/1986 | |
| EP | 0 435 154 | | 7/1991 | |
| EP | 435154 A | * | 7/1991 | ............ B05D/5/12 |

OTHER PUBLICATIONS

S. Ananthakumar, et al., Materials Letters, vol. 43, No. 4, pp. 174–179, "Effects of Nanoparticulate Boehmite Sol as a Dispersant for Slurry Compaction of Alumina Ceramics", Apr. 2000.

* cited by examiner

Primary Examiner—Michael Barr
(74) Attorney, Agent, or Firm—Oblon, Spivak, McClelland, Maier & Neustadt, P.C.

(57) ABSTRACT

Manufacturing process of an electrically insulating and mechanically structuring sheath on an electric conductor which applies notably to the manufacture of superconducting magnets, wherein a ceramic precursor (4) in gel form is formed, then a coating of the conductor (2) with this precursor, and this coating is then heat treated to form the ceramic.

21 Claims, 2 Drawing Sheets

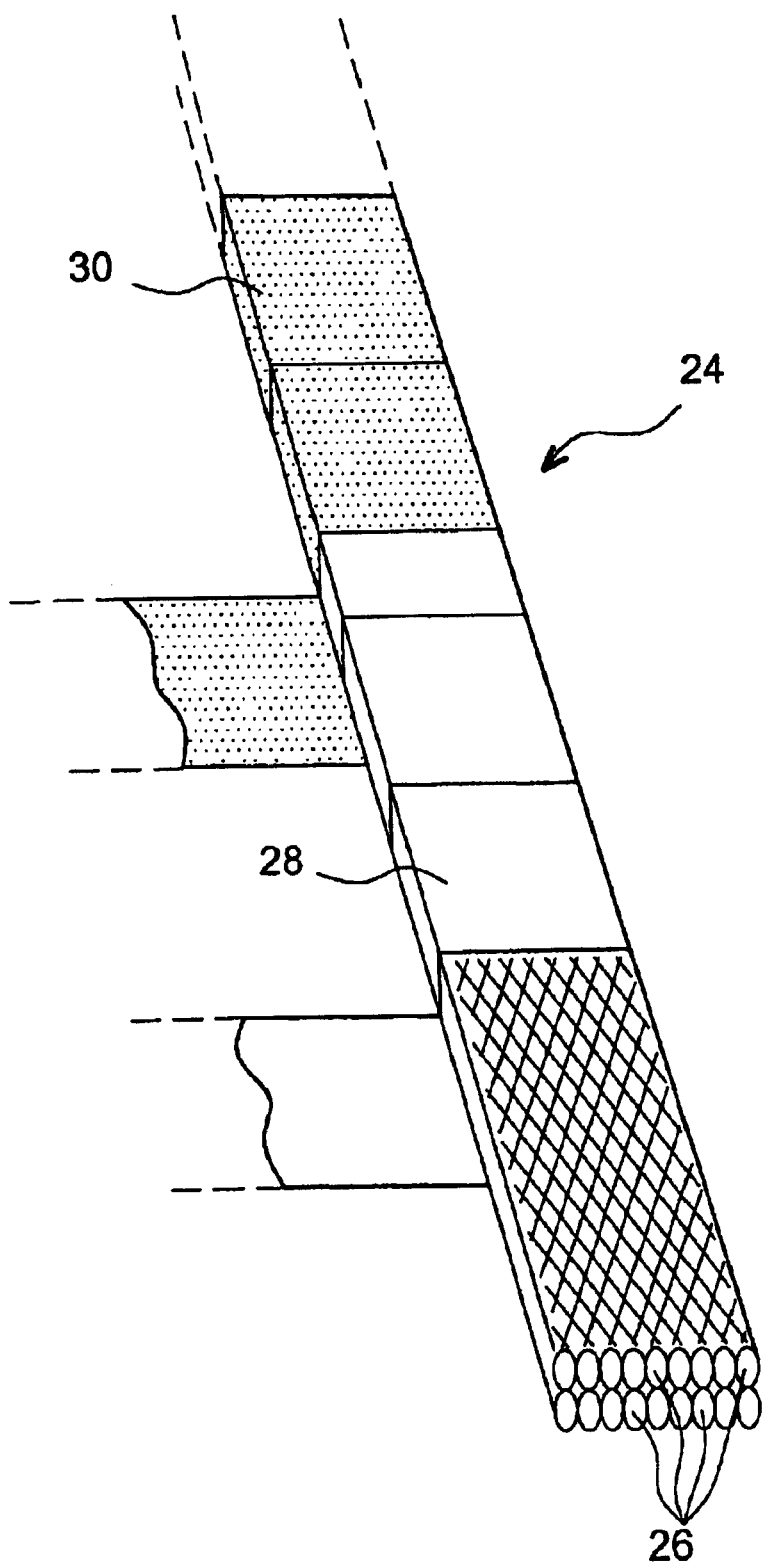

MANUFACTURING PROCESS FOR AN ELECTRICALLY INSULATING AND MECHANICALLY STRUCTURING SHEATH ON AN ELECTRIC CONDUCTOR

TECHNICAL FIELD

The present invention concerns a process for manufacturing an electrically insulating and mechanically structuring sheath on an electric conductor.

The invention applies notably to the manufacture of superconducting magnets as well as the manufacture of pole pieces for an electric motor.

The need to have a structuring electrical insulation, obtained from a flexible ceramic precursor, is common to numerous electrotechnical applications.

The precursor is shown, according to an embodiment of the invention, in the form of a supple impregnated fabric, which facilitates the shaping of the conductor that is to be insulated and, in certain cases, ensures a check on thickness and determines the geometrical precision of windings realized by the conductor.

After a heat treatment at a temperature in the region of 700° C. the precursor is sintered and the electrical insulation thus constituted absorbs the mechanical forces exercised on the conductor at the time of subsequent assembly and operating phases. The ceramic type of insulation realized accepts operating temperatures from 1.8 K to 1270 K.

These properties are essential at the moment of realizing superconducting magnets, capable of generating intense magnetic fields where a major difficulty is encountered.

Indeed, the materials with superconducting properties and the capacity to make high current density circulate, including the intermetallic alloy defined $Nb_3Sn$ or even $Nb_3Al$ require a heat treatment at high temperature (above 600° C. for $Nb_3Sn$ and 700° C. for $Nb_3Al$), of long duration (above 100 hours for $Nb_3Sn$ and in the region of some dozen hours for $Nb_3Al$) and in an inert atmosphere or under vacuum.

The temperature conditions mentioned above prohibit the use of conventional electrical insulators realized on the basis of organic products, during heat treatment. What is more, the superconducting material obtained after this heat treatment is fragile and the possible mechanical stresses which are liable to be applied on it can easily downgrade or harm its superconducting properties.

It is therefore no longer possible, after the heat treatment, to ensure the shaping of this material, nor the bending required for its winding. In these conditions, the fitting of the electrical insulation is particularly awkward.

The conventional solution to remedy the above disadvantages consists in:

taping a superconducting cable, before its winding, using a mineral fibre tape accepting the heat treatment, carrying out this heat treatment, then placing the winding in an impregnation mould under vacuum, and applying an organic resin impregnation.

The operations of transfer of a winding are particularly awkward and have, to this day, never allowed series production of complex windings (of the dipole or quadrupole type), of considerable size (notably of more than 1 meter), using superconductors of the $Nb_3Sn$ family.

The cost of the superconducting materials used (in the order of 750 C/Kg to 2000 C/Kg depending on the realization processes used), as well as treatment time and the length of winding operations represent more than 30% of the cost of manufacturing superconducting electromagnets.

The risk relating to the transfer of the reaction mould (in which the superconducting precursor is transformed into superconductor) to the impregnation mould is therefore very important.

The possibility of having a completely insulated winding with a complete mechanical integrity after the reaction treatment of the superconductor would make it possible to develop industrialization of the superconducting electromagnets.

STATE OF THE PRIOR ART

Electrical insulation techniques are already known on superconducting electromagnets in $Nb_3Sn$. But all these known techniques need an impregnation using epoxy resin and do not provide the mechanical resistance of the superconducting electromagnet winding to resist the magnetic forces generated by the workings of the electromagnet in intense fields.

Other known techniques use a ceramic insulation.

This is particularly referred to in the following document:

EP-A-0044144 (invention of G. R. Sutcliffe, S. J. Warden and D. Humpherson) corresponding to U.S. Pat. No. 4,407,062.

However, all these other recognized techniques consist in depositing an insulator around the strands of a superconducting material, either by passing these strands through a solution of an inorganic precursor, or by extrusion of the precursor around strands through dies, and none of these other known techniques permits having a mineral fibre ribbon, this ribbon being pre-impregnated with the precursor of a ceramic matrix.

DESCRIPTION OF THE INVENTION

The aim of the present invention is to resolve the disadvantages of the known techniques for the manufacture of electrically insulating sheaths on electric conductors in particular those made in superconducting material.

The object of the invention is a manufacturing process for electrical insulator which can be laid on a conducting wire or with which this conductor can be taped, in particular in the case of a conductor designed to be coiled, the process which allows taping the conductor with the insulator or laying the latter, before the winding of the conductor.

This process aims also at giving a certain flexibility to the conductor thus coated, this flexibility facilitating wrapping and especially winding this conductor.

What is more, this process makes the synthesis of a ceramic material possible at the time of a heat treatment.

In the particular case of winding, the invention gives the following results, notably in the case of a superconducting conductor:

the electrical insulation of the conductor is adequate, the mechanical cohesion of the winding at ambient temperature is acceptable, this mechanical cohesion is maintained at the time of cooling the insulated conductor by liquid helium as well as supply of the winding in current, control over winding dimensions is acceptable, in particular as far as the spacing of the winding turns is concerned, and this is the case at any temperature, and the winding conveniently has a certain porosity to liquid helium.

What is more, the ceramic insulator manufactured in compliance with the invention is free of organic phase after the heat treatment and does not require the addition of an organic phase to attain its properties of electrical insulation.

Moreover, in a particular realization mode, this insulator is formed of a reinforced ceramic matrix of short ceramic fibres.

In a precise manner, the object of the present invention is a manufacturing process for an electrically insulating and mechanically structuring sheath on an electric conductor, in particular a conductor in non-superconducting metal or a conductor in superconducting precursor, this process being typified in that it comprises the following stages:

formation of a ceramic precursor in gel form,
formation of a conducting coating with this ceramic precursor in gel form and thus without deposition, and
heat treatment of this coating, this heat treatment being suitable for forming the ceramics from the ceramic precursor in gel form.

According to a preferred implementation mode of the process of the invention, the ceramic precursor is a liquid constituted by a solution comprising water, a mineral component, chosen from among boehmite and clays from the kaolin family, and an organic binding agent, and the mineral component is made to react with an acid to gel the solution and thus obtain the ceramic precursor in gel form.

The acid can be chosen from a group comprising boric acid, citric acid, hydrochloric acid, nitric acid and the carboxylic acids, preferentially formic acid.

The solution, besides, can comprise glass frit and/or at least a supplementary mineral oxide.

According to a particular realization mode of the invention, the solution comprises, in weight percentage, 35% to 45% water, 8% to 30% mineral component, 1% to 10% organic binding agent, 0% to 15% of a single or plurality of supplementary mineral oxides and a complement of glass frit, this complement of glass frit if any ranging, of course, from 0% to 56%.

It should be noted that the role of the water in this solution is to make the mix fluid and also to hydrate the mineral oxides, notably the boehmite and kaolin. In the subsequent treatment, the water is evaporated in the course of a drying operation and, consequently, it would be totally possible to increase slightly artificially the percentage of water in the solution and to reduce proportionately the percentage of the other constituents, without leaving the context of the invention, for all that is needed would be, at this stage, to prolong the drying phase to eliminate the surplus water.

Obviously one should avoid adding too much water which would deteriorate the gel.

According to a preferred realization mode of the invention, the weight percentage of the mineral component is between 15% and 30% in this solution, the complement of glass frit, if any, is therefore of course between 0% and 49%.

Each supplementary mineral oxide can be chosen from the group comprising alumina, zirconia, silica and the alumino-silicate clays.

According to a preferred realization mode of the process of the invention, this process comprises furthermore an elimination stage of the organic binding agent after the formation stage of the coating, this elimination stage beginning before the suitable heat treatment stage to shape the ceramic but ending during this heat treatment, in such a way that these two stages partially overlap over a period of time.

Preferably, the process comprises furthermore an elimination stage of the organic binding agent through reaction with the oxygen, after the formation stage of the coating.

According to a specific first mode for implementation of the process of the invention, the conductor is in precursor of the superconductor $Nb_3Sn$ or $Nb_3Al$, and an overall heat treatment of this conductor provided with the coating is carried out, this overall heat treatment being carried out in a neutral atmosphere and suitable for forming the superconductor $Nb_3Sn$ or $Nb_3Al$, eliminating the organic binding agent and forming the ceramics.

According to a specific second mode for implementation, the conductor is in precursor of a copper oxide based superconductor in particular $YBa_2Cu_3O_7$, $Bi_2Sr_2CaCu_2O_2$ or $Bi_2Sr_2Ca_2Cu_3O_{10}$, and the organic binding agent is eliminated through heating, in the air, of the conductor provided with the coating, then an overall heat treatment is carried out in the air of the conductor provided with the coating, this overall heat treatment being suitable for forming the copper oxide based superconductor and forming the ceramics.

According to a specific third mode of realization, the conductor is in a non-superconducting metal and an overall heat treatment is carried out on this conductor provided with the coating, this overall heat treatment being carried out in a neutral atmosphere and suitable for eliminating the organic binding agent and forming the ceramics.

The formation stage of the coating can comprise a stage of deposit of the ceramic precursor in gel form on a ceramic fibre fabric previously de-sized (that is to say a ceramic fibre fabric where the sizing has previously been removed), hen an arrangement mode of the fabric provided with the ceramic precursor around the conductor.

The ceramic fibres can be made in a material chosen from E glass, C glass, R glass, S2 glass, Silica, Alumina and Mullite.

The ceramic fibre fabric can be previously de-sized by heat or chemically.

According to a specific realization mode of the invention the conductor provided with the coating is put into shape and in particular coiled, before the heat treatment stage suitable for forming the ceramics.

BRIEF DESCRIPTION OF THE DRAWINGS

The present invention will be better understood upon reading the description of examples of realization given below, simply as an indication and not all comprehensive, by referring to the drawings in Appendix on which:

FIG. 2 illustrates diagrammatically a particular application of the invention.

DETAILED DESCRIPTION OF SPECIFIC REALIZATION MODES

Figure 1:
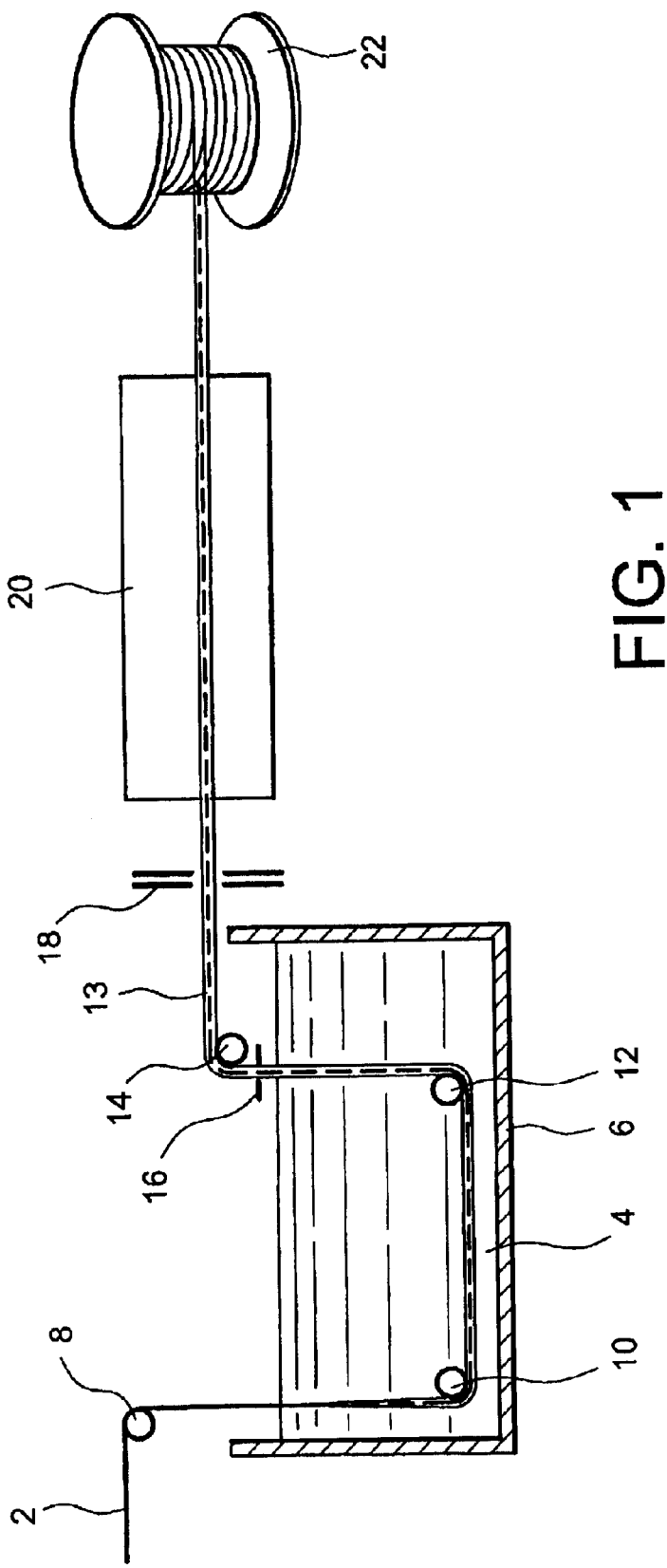
FIG. 1 illustrates diagrammatically a specific implementation mode of the process of the invention.

Examples of the manufacturing process are given now for an electrically insulating and mechanically structuring sheath on an electric conductor in compliance with the invention. This conductor is, for example, a wire or an electric cable.

It is appropriate to note that the process applies both to ordinary conductors in non-superconducting metals as well as to superconductors. What is more, this process is compatible with the technique referred to as WAR (Wind and React).

In an example of the invention, a glass ribbon impregnated with a ceramic precursor is used. This ceramic precursor is obtained from a liquid solution and it is without deposition, for the liquid solution contains boehmite and a clay from the kaolin family which is made to react with an acid to obtain a gel of this liquid solution.

This homogeneous property of the ceramic precursor resulting in obtaining a structuring insulator, facilitates its use at the time of its deposit on the conductor, in particular in the case where this deposit is made by passing the conductor in a bath of this ceramic precursor, this bath being used to form a flexible sheath which allows the subsequent shaping (in particular the winding) of the conductor.

After firing of the conductor thus treated and shaped, the sheath is rigid and the conductor (in particular the superconductor) becomes electrically insulated and embedded in a ceramic matrix. The resistance to mechanical stresses is considerably increased as compared to the prior art. The electrical insulation is very acceptable and the porosity of the sheath is low because of the vitrification.

It is to be noted that the invention applies in particular to the manufacture of high-field electromagnets and windings for electric motors.

Let us now give an example of the process of the invention.

In a first stage of this process, the ceramic precursor is made in the form of a liquid solution, more or less glutinous and without deposition.

The composition of this solution in weight percentage is:

35% to 40% water,

1% to 10% of an organic binding agent (commercially available),

15% to 30% boehmite or a clay of the kaolin family,

0% to 15% of other mineral oxides such as alumina, zirconia, silica and an alumino-silicate clay (for example mica), which form a contribution of mineral fillers, and 5% to 49% of glass frit.

After stirring this solution, for example using a slow jar revolving device, or a magnetic stirrer, acid is added to obtain a gel of the solution in the presence of boehmite or clay of the kaolin family. Formic acid is used, for example, with a weight percentage of 0.3% to 2%. In this way the deposition is removed.

The gel is formed by the chemical reaction of the acid on the boehmite or the clay of the kaolin family and the remainder of the solution becomes trapped in the gel. The gel results in using much less organic binding agent as compared with the conventional technique which consists in adding an organic dispersing agent which will have to be removed subsequently.

As far as the gel is concerned in presence of boehmite but in a totally different technical field, please refer to the following document:

Article by F. Ananthakumar & al., Materials Letters 43, pages 174–179, 2000.

In this example formic acid is used, as the molecule of this acid only contains one carbon atom and provides interesting gelling properties but other acids can be used, for example, nitric acid, boric acid, hydrochloric acid, citric acid or another acid of the carboxylic family of acids. What is more, formic acid is a relatively strong acid among the weak acids, but if a weaker acid is used, more acid must be used.

The viscosity of the solution is adjusted according to needs by measuring diverse mineral fillers and water.

In particular fibrous fillers can be added to obtain a viscous or even pasty ceramic precursor. Between 5% and 40% of fibrous filler is used to obtain a sufficiently glutinous texture.

After having made the ceramic precursor in the form of a gel, the wire or the cable can be coated directly by circulation of the latter in a bath of this ceramic precursor in the form of gel.

In an embodiment of this example, after the stage of making the ceramic precursor in the gel form, there is a stage of de-sizing and impregnation of a ceramic fibre ribbon.

This ceramic fibre ribbon is first of all de-oiled. This ribbon is for example in E glass, C glass, R glass, S2 glass, silica, alumina or mullite (which is a silicate forming an essential constituent of ceramics).

This ribbon can be obtained in commerce, for example in E glass from the Bourgeois Company or S2 glass from the Hiltex Company or in commercialized ceramics under the brand name Nextel from the 3M Company.

Silica fibre can also be used, marketed under the name Quartzel by the St-Gobain Company, preferably fabric 60 μm thick by the Textile Bourguisanne Company.

The de-sizing can be carried out through heat treatment (according to the recommendations of the maker of the ribbon), for example at 700° C. for 1 minute or 350° C. for 20 hours.

As an embodiment a chemical de-sizing with a suitable solvent is used. In this case, the solvent is used only to dissolve the sizing. The choice of the solvent and the period of time in solution depends on the type of ribbon and the products used for its sizing. The solvent must therefore only dissolve polymers and must not attack the ceramic fibre.

The de-sized ribbon is then impregnated with a ceramic precursor in gel form.

Then the ribbon thus impregnated is placed around the wire or the conducting cable, this ribbon forming at this stage a flexible sheath, then the conductor is shaped. As an example this conductor is wound.

Then 3 cases can be differentiated.

(1) If the conductor is made of a superconducting precursor, in other words the $Nb_3Sn$ or $Nb_3Al$ precursor (before this material is subjected to heat treatment which gives it its superconducting properties), the following are carried out at this stage simultaneously by rise in temperature:

the $Nb_3Sn$ or $Nb_3Al$ reaction heat treatment, the elimination by firing of the organic binding agent (and carbonaceous residues) in a neutral atmosphere (in an argon or nitrogen atmosphere) with a contribution of oxygen at the moment when the temperature is sufficient to start carbonization (oxidation) of the binding agent (about 350° C. to 450° C. depending on the binding agent) so as to inject a minimum amount of oxygen (corresponding to complete carbonization), which results in obtaining complete carbonization of the binding agent without oxidation of the conductor for, between 350° C. and 450° C. the oxidation reaction is very preferentially active on the binding agent, and the sintering of the ceramics.

For this overall heat treatment, in the case of $Nb_3Sn$, the temperature must be raised from ambient temperature (about 20° C.) up to a plateau in the region of 600° C. to 700° C. (reaction temperature of the $Nb_3Sn$) for a period of 100 hours to 300 hours, length of time which is needed to transform the superconductor precursor into a $Nb_3Sn$ superconductor.

In the case of the conductor with the $Nb_3Al$ precursor, the temperature must be raised from ambient temperature to a plateau in the region of 700° C. to 800° C. (reaction temperature of the $Nb_3Al$) for a period of several dozen hours, a length of time which is needed to transform the superconductor precursor into a $Nb_3Al$ superconductor.

The binding agent and the ceramic precursor react also in the above temperature range.

The rise in temperature must be watched carefully and must be very slow so that the conductor does not 'explode' during the change from tin (or aluminium) to a liquid state, which causes too intense an expansion.

In an embodiment, the atmosphere is modified gradually by introducing a slightly reducing gas mixture (for example a mixture containing less than 5% hydrogen and more than 95% nitrogen for, if there was more hydrogen, the mixture would be explosive) at the beginning of the reaction heat treatment stage of the $Nb_3Sn$ or $Nb_3Al$. This mixture replaces the argon or nitrogen atmosphere and helps to make sure that the conductor will not be oxidized by oxygen residue if any.

The following is equally viable for cases (2) and (3).

As far as the elimination of the organic binding agent is concerned, it is recommended that the reaction must take place at temperatures compatible with sintering of the ceramics and the superconductor reaction treatment, and must also leave no carbon residue (which is an acceptable electric conductor).

Oxygen is used here with which it is certain to obtain total elimination by formation of gas. What is more, this reaction is very rapid as soon as 350° C. is exceeded. The gas generated (CO or $CO_2$) must be evacuated. This is why the heat treatment is carried out under gas scavenging conditions.

Moreover, elimination of the binding agent and sintering is made during the same operation through chain formation and interleaving the elimination phase of the binding agent and the sintering phase. This is an essential characteristic of the example under consideration of the invention.

In fact, the sheath does not disintegrate due to this interleaving, or partial overlapping over a period of time, of the elimination stage of the binding agent and the stage of sintering. Without interleaving, there would be risk of obtaining a very fragile pulverulent sheath and it should not disturb the formed conductor. Now, in the prior art, these stages are separated and this requires an impregnation of resin.

Furthermore, when one wishes to shape a very accurate winding, which is the case of superconducting magnets of dipolar or quadrupole types, it is preferably placed in a mould, for example in heat-resisting steel, for the elimination operation of the binding agent and the sintering, and gas scavenging is carried out in this mould.

(2) If the conductor is made of a superconducting precursor based on copper oxide such that:

$YBa_2Cu_3O_7$ of critical temperature 92 K,
$Bi_2Sr_2CaCu_2O_8$ of critical temperature 95 K
$Bi_2Sr_2Ca_2Cu_3O_{10}$ of critical temperature 110 K the stage of complete elimination of the organic binding agent is realized by firing in air according to the parameters of temperature, duration and rise in temperature which depend on the binding agent chosen and which are indicated by the supplier of the latter.

Later, both the reaction heat treatment of the superconductor and sintering of the ceramics take place. The parameters for this heat treatment, which is carried out in air, are a stage temperature in the region of 800° C. to 900° C. and a stage time of 10 minutes to 3 hours.

(3) If the conductor is made in a metal or a non-superconducting metal compound, the heat elimination stage of the organic binding agent takes place in neutral atmosphere, with introduction of a controlled quantity of oxygen, corresponding to the complete carbonization of the binding agent. In fact, in air the metal would be totally oxidized, unless this metal was gold.

Purely as an indication and by no means comprehensive, an example of the process in compliance with the invention is given, making reference to FIG. 1.

In this drawing a wire 2 can be seen on which a coating 13 of the ceramic precursor is formed in gel form by passing this wire 2 through this ceramic precursor in gel form 4 contained in a recipient 6.

It can also be seen that the wire passes over a succession of pulleys 8, 10, 12 and 14 and also passes through a series of thickness control devices 16 and 18 to remove the excess quantities of the coating 13 formed on the wire. The wire is then dried by passing through a drying oven 20 and later wound on an appropriate coil 22.

The wire thus wound can later be subjected to the heat treatments mentioned above which result in elimination of the binding agent, formation of the ceramics and formation of the superconductor when the wire 2 is superconducting.

The wire 2 is thus provided with an electrically insulating and mechanically structuring sheath.

As an example, an application of the invention for the manufacture of windings of superconducting electromagnets in $Nb_3Sn$ is now given, which are suitable for accepting the heat treatment of the conductor and, in course of operation, considerable mechanical stress due to Lorenz forces.

More precisely, quadrupole electromagnets are manufactured each comprising four identical windings. Each of these needs about 75 m of superconductor cable. The latter, of slightly trapezoidal cross-section, is made up of 36 $Nb_3Sn$-based strands. These strands have a diameter of 0.825 mm and are twisted together and spread in two layers.

The dimensions of the straight cross-section of this cable are: 1.362 mm for the short side, 1.598 mm for the long side and 15.1 mm for the width.

Each of the lengths (75 m) of cable is taped with about 400 m of a 15 mm wide ribbon.

This ribbon is made up of ceramic fibres and impregnated with a solution containing boehmite and mica as mineral fillers, a glass frit marketed under the reference VN 821 by the Cerdec Company, a dispersing agent and a binding agent respectively marketed under the references D-3005 and B-1000 by the Rohm and Haas Company and water as a solvent.

This is diagrammatically illustrated by the example in FIG. 2 where a cable 24 (before treatment) can be seen. This cable is a flat cable of Rutherford type, with two layers of strands 26.

The cable 24 is taped—a first ribbon 28 in glass fibres can be seen, which is impregnated with ceramic precursor and which surrounds the cable 24.

Furthermore, a second ribbon 30 of glass fibres can be seen, which is identical to the first and therefore equally impregnated with ceramic precursor.

Each of these ribbons 28 and 30 is wound around the cable in such a way that the edge of a ribbon turn is against the edge of the adjacent turn, but, with a view to providing for the continuity of the electrical insulation, the second ribbon 30, which is wound above the first, is offset by a half-pitch in relation to this first ribbon 28.

Other types of glass frits and/or binding agents can be used.

After having formed the windings, the latter are subjected to a heat treatment comprising heating at 6° C./hour up to 660° C. This heating is followed by a stage of 240 hours at 660° C. and slow cooling in the chamber of the oven used for the heat treatment.

Before this heat treatment, the air contained in this chamber is evacuated and the latter is filled with a neutral gas such as argon. Furthermore, a continuous scavenging of the argon takes place during the heat treatment.

To achieve superconductor status, each winding is cooled at the temperature of the liquid helium (4.2 K at atmospheric pressure) or to that of superfluid helium (equal or less than 2.1 K at atmospheric pressure).

It is advisable to note that, during excitation of each electromagnet by a current, considerable Lorenz forces are created in the windings of the latter.

The invention also applies to the manufacture of small compact superconducting solenoids, free of structuring metallic elements.

The invention can also be used for the windings of superconducting rotating electric machines.

The invention can moreover be used for the windings of non-superconducting rotating electric machines, designed to operate at high temperature (above 300° C.).

The invention can also be used for the manufacture of electrical insulation resisting intense heat, for example a flame, or projections of very hot liquid due to the low porosity of the structuring insulation.

What is claimed is:

1. Manufacturing process of an electrically insulating and mechanically structuring sheath on an electric conductor, which comprises the stages of:
   formation of a ceramic precursor in gel form,
   formation of a coating of the conductor with the ceramic precursor in gel form, and
   heat treatment of the coating, thereby forming a ceramic from the ceramic precursor in gel form,
   wherein the ceramic precursor in gel form is formed from a liquid solution comprising water, a mineral component selected from the group consisting of boehmite and clays of the kaolin family, and an organic binding agent, wherein the mineral component is made to react with an acid to gel the solution, thereby forming the ceramic precursor in gel form.

2. Process according to claim 1, acid is selected from the group consisting of boric acid, citric acid, hydrochloric acid, nitric acid and carboxylic acids.

3. Process according to claim 1, wherein the solution further comprises glass fit.

4. Process according to claim 1, wherein the solution further comprises at least one supplementary mineral oxide.

5. Process according to any claim 1 wherein the solution comprises, in weight percentage, 35% to 45% water, 8% to 30% mineral component, 1% to 10% of organic binding agent, 0% to 150/of one or a plurality of supplementary mineral oxides and an optional glass frit.

6. Process according to claim 5, wherein the weight percentage of the mineral component is between 15% and 30%.

7. Process according to claim 4, wherein the at least one supplementary mineral oxide is selected from the group consisting of alumina, zirconia, silica and the aluminosilicate clays.

8. Process according to claim 1, additionally comprising a stage of elimination of the organic bin ing agent after the formation of the coating, wherein the stage of elimination begins before the stage of heat treatment but end ng during the stage of heat treatment.

9. Process according claim 1, further comprising a stage of elimination of the organic binding agent through reaction with oxygen, after the formation of the coating stage.

10. Process according to claim 1, wherein prior to heat treatment of the coating stage, the conduct (2) is present as a precursor of the superconductor $Nb_3$ Sn or $Nb_3l$, and the heat treatment is carried out in a neutral atmosphere, thereby forming the superconductor $Nb_3Sn$ or $Nb_3Al$, eliminating the organic binding agent, and forming the ceramic.

11. Process according to claim 1, wherein prior to heat treatment of the coating state, the conduct is present as a precursor of a copper oxide based superconductor, and the organic binding agent is eliminated by heating, in the air, and the the heat treatment is out, in the air, thereby forming the copper oxide based superconductor and forming the ceramic.

12. Process according to claim 1, wherein the conductor is a non-superconducting metal, and the heat treatment of the coating stage is carried out in a neutral atmosphere, thereby eliminating the organic binding agent and forming the ceramic.

13. Process according to which claim 1, wherein the formation stage of the coating stage comprises a stage of deposit of the ceramic precursor in gel form on a material of ceramic fibres previously de-sized, thereby forming a fabric, followed by a stage of arrangement of the fabric around the conductor.

14. Process according to claim 13, wherein the ceramic fibres are made of a material selected from the group consisting E glass, C glass, R glass, S2 glass, silica, alumina and mullite.

15. Process according to claim 13, wherein the fabric is previously de-sized by heat or chemically.

16. Process according to claim 1, wherein prior to heat treatment of the coating stage, the conduct provided with the coating is put into a shape.

17. Process according to claim 5, a wherein the at least ne supplementary mineral oxide is selected from the group consisting of alumina, zirconia, silica and the aluminosilicate clays.

18. Process according to claim 1, wherein the electric conductor is a non-superconducting metal or a superconductor.

19. Process according to claim 2, wherein the acid is formic acid.

20. Process according to claim 11, wherein the copper oxide based superconductor is selected from the group consisting of $YBa_2Cu_3k\ O_7$, $Bi_2Sr_2aCu_2O_8$ and $Bi_2Sr_2Ca_2Cu_3O_{10}$.

21. Process according to claim 16, wherein the shape is a coil.

* * * * *